United States Patent
Pan et al.

(10) Patent No.: US 11,699,771 B2
(45) Date of Patent: Jul. 11, 2023

(54) NON-DIFFUSION TYPE PHOTODIODE

(71) Applicant: LandMark Optoelectronics Corporation, Tainan (TW)

(72) Inventors: Huang-wei Pan, Tainan (TW); Hung-Wen Huang, Tainan (TW); Yung-Chao Chen, Tainan (TW); Yi-Hsiang Wang, Tainan (TW)

(73) Assignee: LANDMARK OPTOELECTRONICS CORPORATION, Tainan (TW)

( * ) Notice: Subject to any disclaimer, the term of this patent is extended or adjusted under 35 U.S.C. 154(b) by 27 days.

(21) Appl. No.: 17/356,711

(22) Filed: Jun. 24, 2021

(65) Prior Publication Data
US 2022/0336690 A1    Oct. 20, 2022

(30) Foreign Application Priority Data
Apr. 16, 2021   (TW) .................. 110113829

(51) Int. Cl.
| H01L 31/105 | (2006.01) |
| H01L 31/18 | (2006.01) |
| H01L 31/107 | (2006.01) |
| H01L 31/0352 | (2006.01) |

(52) U.S. Cl.
CPC ........ *H01L 31/105* (2013.01); *H01L 31/0352* (2013.01); *H01L 31/107* (2013.01); *H01L 31/1804* (2013.01); *H01L 31/184* (2013.01)

(58) Field of Classification Search
CPC ............... H01L 31/105; H01L 31/1804; H01L 31/035281; H01L 31/03529; H01L 31/1075
See application file for complete search history.

(56) References Cited

U.S. PATENT DOCUMENTS

| 5,866,936 A * | 2/1999 | Hasnain ............. H01L 31/1075 257/466 |
| 6,936,868 B2 | 8/2005 | Hiraoka et al. |
| 8,039,918 B2 | 10/2011 | Nakata |
| (Continued) | | |

FOREIGN PATENT DOCUMENTS

| CN | 109817755 A | 5/2019 |
| JP | H04332178 A | 11/1992 |
| (Continued) | | |

OTHER PUBLICATIONS

JP 10270741, Okubo (Year: 1998).*

*Primary Examiner* — Ahmed N Sefer
(74) *Attorney, Agent, or Firm* — Mark M. Friedman

(57) ABSTRACT

A non-diffusion type photodiode is described and has: a substrate, a buffer layer, a light absorption layer, an intermediate layer, and a multiplication/window layer. The buffer layer is disposed on the substrate. The light absorption layer is disposed on the buffer layer. The intermediate layer is disposed on the light absorption layer and has a first boundary, wherein the intermediate layer is an I-type semiconductor layer or a graded refractive index layer. The multiplication/window layer is disposed on the intermediate layer and has a second boundary, wherein in a top view, the first boundary surrounds the second boundary, and a distance between the first boundary and the second boundary is greater than or equal to 1 micrometer. The non-diffusion type photodiode can reduce generation of dark current.

9 Claims, 2 Drawing Sheets

(56) References Cited

U.S. PATENT DOCUMENTS

| | | |
|---|---|---|
| 9,570,647 B2 | 2/2017 | Yuan et al. |
| 2004/0106265 A1* | 6/2004 | Vickers ............... H01L 31/107 |
| | | 257/E31.063 |
| 2004/0188807 A1 | 9/2004 | Hiraoka et al. |
| 2005/0006729 A1* | 1/2005 | Hoag ................... H01L 29/868 |
| | | 257/656 |
| 2008/0121866 A1 | 5/2008 | Yuan et al. |
| 2009/0020841 A1* | 1/2009 | Hu ....................... H01L 31/105 |
| | | 257/E31.001 |
| 2009/0242934 A1 | 10/2009 | Hu |
| 2009/0315073 A1 | 12/2009 | Shi et al. |
| 2010/0133637 A1* | 6/2010 | Yagyu ................ H01L 31/1075 |
| | | 257/438 |
| 2011/0024863 A1* | 2/2011 | Koi ...................... H01L 31/105 |
| | | 257/458 |
| 2011/0241070 A1* | 10/2011 | Yagyu ................ H01L 31/1075 |
| | | 257/E31.064 |
| 2017/0077329 A1* | 3/2017 | Wichman ....... H01L 31/022408 |
| 2021/0367084 A1* | 11/2021 | Boles ................. H01L 29/0657 |

FOREIGN PATENT DOCUMENTS

| | | |
|---|---|---|
| JP | 2005286000 A1 | 10/2005 |
| JP | 2011055014 A | 3/2011 |
| WO | 2008090733 A1 | 7/2008 |

\* cited by examiner

NON-DIFFUSION TYPE PHOTODIODE

CROSS REFERENCE TO RELATED APPLICATION

This application claims priority to Taiwan Patent Application No. 110113829, filed on Apr. 16, 2021, which is incorporated herein by reference in its entirety.

FIELD OF DISCLOSURE

The present disclosure relates to a photodiode, and more particularly to a non-diffusion type photodiode.

BACKGROUND OF DISCLOSURE

In addition to a light absorption layer, an avalanche photodiode used in optical communication is also provided with a multiplication/window layer. Compared with general photodiodes, the avalanche photodiode has advantages of high sensitivity and fast speed. However, the avalanche photodiode is usually made by diffusing carriers in a layered structure to make the multiplying/window layer, so multiple processes are required.

Therefore, the subsequent industry has developed a non-diffusion type (or as-grown type) photodiode, where a multiplying/window layer is directly formed instead of being produced by diffusion. However, this non-diffusion type photodiode generates a relatively large dark current (for example, about $6.51 \times 10^{-9}$ A), which is not beneficial to the application of the non-diffusion type photodiode to various industries.

Therefore, it is necessary to provide a non-diffusion type photodiode to solve problems existing in the conventional technology.

SUMMARY OF DISCLOSURE

An object of the present disclosure is to provide a non-diffusion type photodiode, which reduces generation of dark current by defining a specific boundary relationship between an intermediate layer and a multiplication/window layer.

To achieve the above object, the present disclosure provides a non-diffusion type photodiode comprising: a substrate, a buffer layer, a light absorption layer, an intermediate layer, and a multiplication/window layer. The buffer layer is disposed on the substrate. The light absorption layer is disposed on the buffer layer. The intermediate layer is disposed on the light absorption layer and has a first boundary, wherein the intermediate layer is an I-type semiconductor layer or a graded refractive index layer. The multiplication/window layer is disposed on the intermediate layer and has a second boundary, wherein in a top view, the first boundary surrounds the second boundary, and a distance between the first boundary and the second boundary is greater than or equal to 1 micron.

In an embodiment of the present disclosure, a distance between the first boundary and the second boundary is between 1 micrometer and 15 micrometers.

In an embodiment of the present disclosure, the distance between the first boundary and the second boundary is between 2 micrometers and 15 micrometers.

In an embodiment of the present disclosure, the buffer layer is an N-type buffer layer, the light absorption layer is an I-type light absorption layer, and the multiplication/window layer is a P-type multiplication/window layer.

In an embodiment of the present disclosure, material of the N-type buffer layer includes N-type InP.

In an embodiment of the present disclosure, material of the I-type light absorption layer includes I-type InGaAs.

In an embodiment of the present disclosure, material of the P-type multiplication/window layer includes P-type InAlAs.

In an embodiment of the present disclosure, the intermediate layer is an I-type semiconductor layer, and material of the I-type semiconductor layer includes I-type InP.

In an embodiment of the present disclosure, the further non-diffusion type photodiode further comprises a contact layer disposed on the multiplier/window layer.

In an embodiment of the present disclosure, the contact layer is a P-type contact layer, and material of the P-type contact layer includes P-type InGaAs.

DETAILED DESCRIPTION OF PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, and etc., are only directions by referring to the accompanying drawings, and thus the used directional terms are used to describe and understand the present disclosure, but the present disclosure is not limited thereto.

Figure 1A:
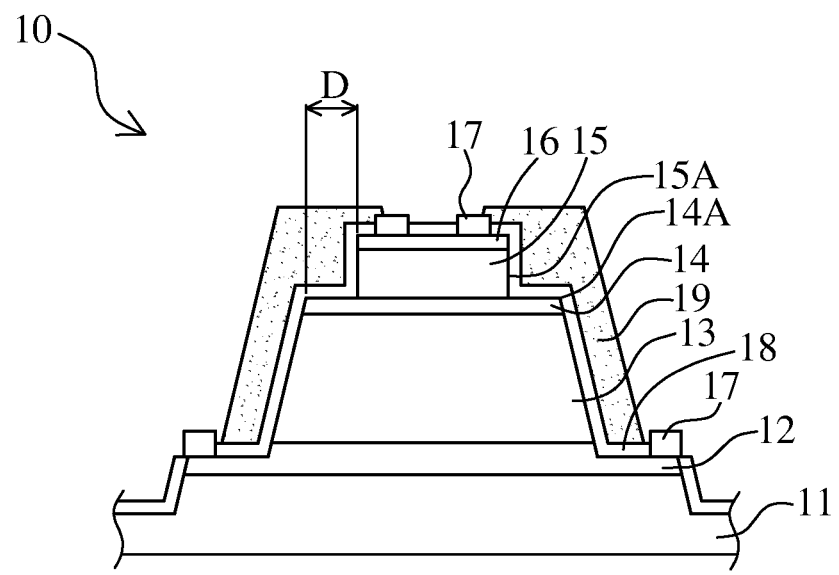
FIG. 1A is a schematic cross-sectional view of a non-diffusion type photodiode according to an embodiment of the present disclosure.
Figure 1B:
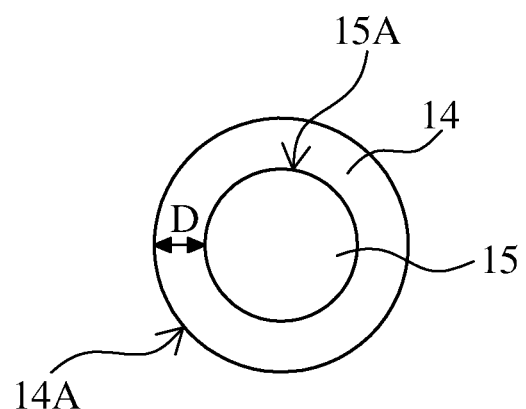
FIG. 1B is a schematic top view of an intermediate layer and a multiplication/window layer of a non-diffusion type photodiode according to an embodiment of the present disclosure.

Please refer to FIG. 1A and FIG. 1B. FIG. 1A is a schematic cross-sectional view of a non-diffusion type photodiode according to an embodiment of the present disclosure. FIG. 1B is a schematic top view of an intermediate layer and a multiplication/window layer of a non-diffusion type photodiode according to an embodiment of the present disclosure, wherein FIG. 1B shows the relationship between the intermediate layer and the multiplier/window layer in a top view, and other structures are not shown. In an embodiment of the present disclosure, the non-diffusion type photodiode 10 includes: a substrate 11, a buffer layer 12, a light absorption layer 13, an intermediate layer 14, and a multiplier/window layer 15. The substrate 11 may be, for example, an N-type substrate. It is noted that material of the substrate 11 can refer to material of known substrates used in existing photodiodes. The substrate 11 is mainly used to support various layered structures or devices of the non-diffusion type photodiode 10, such as the buffer layer 12, the light absorption layer 13, the intermediate layer 14, the multiplication/window layer 15, and so on.

In an embodiment of the present disclosure, the buffer layer 12 of the non-diffusion type photodiode 10 is disposed on the substrate 11. In an embodiment, the buffer layer 12 is, for example, an N-type buffer layer, and material of the N-type buffer layer includes, for example, N-type InP (for example, N⁺-type InP). It is noted that material of the buffer layer 12 can refer to the material of known buffer layers used in existing photodiodes.

In an embodiment of the present disclosure, the light absorption layer 13 of the non-diffusion type photodiode 10 is disposed on the buffer layer 12. In an embodiment, the light absorption layer 13 is, for example, an I-type light absorption layer, and material of the I-type light absorption layer includes, for example, I-type InGaAs. It is noted that material of the light absorption layer 13 can refer to material of known light absorption layers used in existing photodiodes.

In an embodiment of the present disclosure, the intermediate layer 14 of the non-diffusion type photodiode 10 is disposed on the light absorption layer 13 and has a first boundary 14A, wherein the intermediate layer 14 is an I-type semiconductor layer or a graded refractive index layer (GRIN layer). In an embodiment, the intermediate layer 14 is an I-type semiconductor layer. For example, material of the I-type semiconductor layer includes I-type InP. In another embodiment, the intermediate layer 14 is the GRIN layer. It is noted that, material of the I-type semiconductor layer of the present disclosure can refer to material of a known I-type semiconductor layer used in existing photodiodes, and/or material of the GRIN layer of the present disclosure can refer to material of a known GRIN layer used in the existing photodiode.

In an embodiment of the present disclosure, the multiplication/window layer 15 of the non-diffusion type photodiode 10 is disposed on the intermediate layer 14 and has a second boundary 15A. In a top view (as shown in FIG. 1B), the first boundary 14A surrounds the second boundary 15A, and a distance between the first boundary 14A and the second boundary 15A is greater than or equal to 1 micrometer. In an embodiment, the multiplication/window layer 15 is a P-type multiplication/window layer. For example, material of the P-type multiplication/window layer includes P-type InAlAs. In another embodiment, a distance between the first boundary 14A and the second boundary 15A is between 1 micrometer (μm) and 15 micrometers. In a further embodiment, a distance between the first boundary 14A and the second boundary 15A is between 2 micrometers and 15 micrometers.

It is noted that at least one feature of the non-diffusion type photodiode 10 in an embodiment of the present disclosure is in the boundary relationship between the intermediate layer 14 and the multiplication/window layer 15, which can be used to improve a dark current of the non-diffusion type photodiode. Specifically, in a top view (as shown in FIG. 1B), a position of the multiplication/window layer 15 overlaps with a position of the intermediate layer 14, and an area of the multiplication/window layer 15 is smaller than an area of the intermediate layer 14 (i.e., a mesa area is defined between the multiplier/window layer 15 and the middle layer 14). In other words, in a top view of the non-diffusion type photodiode (for example, viewed from top to bottom), the area of the intermediate layer 14 is surrounded by the first boundary 14A, and the area of the multiplier/window layer 15 is surrounded by the second boundary 15A, such that the first boundary 14A surrounds the second boundary 15A. In another aspect, a distance D between the first boundary 14A and the second boundary 15A is greater than or equal to 1 micrometer. In an example, the distance D basically refers to a minimum distance from any point on the first boundary 14A to the second boundary 15A. By setting the boundary relationship between the intermediate layer 14 and the multiplication/window layer 15 (i.e., the distance D), the dark current of the non-diffusion type photodiode 10 can be improved (or reduced). Detailed experimental data are described in the following paragraphs.

In an embodiment, the non-diffusion type photodiode 10 further includes a contact layer 16 disposed on the multiplication/window layer 15. The contact layer 16 is a P-type contact layer, and material of the P-type contact layer includes P-type InAlAs.

In addition, it is noted that the non-diffusion type photodiode 10 according to an embodiment of the present disclosure may also include any layered structure or device that may be provided in a known photodiode, such as a reflective layer, a charging layer, a passivation layer 18, an encapsulation layer 19, a metal contact 17, and/or so on.

Several embodiments and comparative examples are listed below to prove that the non-diffusion photodiode of the embodiments of the present disclosure can indeed improve (or reduce) the dark current.

Embodiment 1

An N-type substrate (such as N—InP substrate) is provided, and then a buffer layer (such as an N⁺ type InP layer), a light absorption layer (such as an I-type InGaAs layer), an intermediate layer (such as an I-type semiconductor layer (such as an I-type InP layer) or a GRIN layer), a multiplication/window layer (such as a P-type InAlAs layer), and a contact layer (such as a P-type InAlAs layer) are sequentially formed on the N-type substrate, so as to form the non-diffusion type photodiode of Embodiment 1. Then, a known semiconductor process (such as an etching process, etc.) is used, so that in a top view, the first boundary of the intermediate layer surrounds the second boundary of the multiplication/window layer, where a distance between the first boundary and the second boundary is about 1 micrometer.

Then, a dark current of Embodiment 1 is measured by a commercially available current measuring instrument. Dark current is defined as, a background current value of a photodiode when a reverse voltage is −5V, where the photodiode is not illuminated. The unit is ampere (A). Please refer to Table 1 below for test results.

TABLE 1

|  | Distance D (um) | Dark current (A) |
| --- | --- | --- |
| Comparative example 1 | 0 | $6.51 \times 10^{-9}$ |
| Embodiment 1 | 1 | $4.34 \times 10^{-9}$ |
| Embodiment 2 | 2 | $5.28 \times 10^{-11}$ |
| Embodiment 3 | 3 | $2.17 \times 10^{-11}$ |
| Embodiment 4 | 8 | $2.74505 \times 10^{-11}$ |
| Embodiment 5 | 9 | $2.8427 \times 10^{-11}$ |
| Embodiment 6 | 10 | $2.3436 \times 10^{-11}$ |
| Embodiment 7 | 12 | $1.6275 \times 10^{-11}$ |
| Embodiment 8 | 13 | $2.00 \times 10^{-11}$ |
| Embodiment 9 | 15 | $1.59 \times 10^{-11}$ |

Embodiments 2-9

The manufacturing methods of Embodiments 2 to 9 are substantially the same as that of Embodiment 1, except that the distance between the first boundary and the second boundary is different. Please refer to Table 1 above for the test results of Embodiments 2-9.

Comparative Example 1

Figure 2:
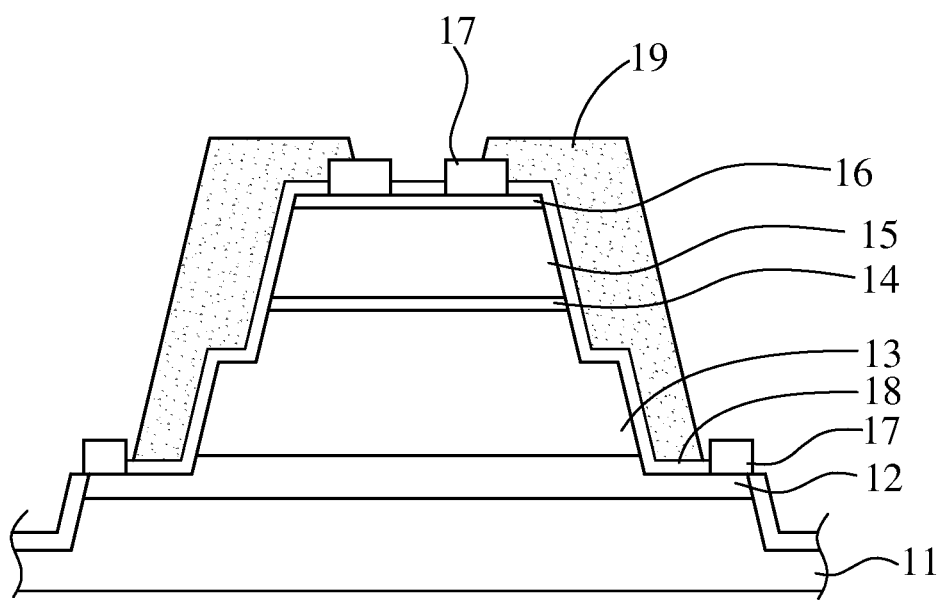
FIG. 2 is a schematic cross-sectional view of Comparative Example 1.

The manufacturing method of Comparative example 1 is substantially the same as that of Embodiment 1, except that the first boundary and the second boundary overlap (that is, the distance between the first boundary and the second boundary is 0). It is noted that, in Comparative example 1, the etching process is performed directly to the light absorption layer 13, instead of stopping at the intermediate layer 14. That is, the etching process of Comparative example 1 is stopped at the light absorption layer 13. Therefore, the boundary of the intermediate layer 14 overlaps with the boundary of the light absorption layer 13 (as shown in FIG. 2). For the test result of Comparative example 1, please refer to Table 1 above.

It can be seen from Table 1 that compared to Comparative example 1, the dark current of Embodiment 1 is reduced by approximately 33.3%, and the dark currents of Embodiments 2 to 9 are reduced by approximately 99.1%-99.8%. It can be seen that Embodiments 1 to 9 have the effect of improving the dark current. In addition, when the distance D is greater than or equal to 2 micrometers, the dark current can be greatly reduced.

It is noted that, terms used in the embodiments of the present disclosure, such as substrate, buffer layer, light absorption layer, I-type semiconductor layer, GRIN layer, multiplication/window layer, contact layer, reflective layer, charging layer, or metal contact, etc., which can refer to definitions of photodiode related fields, so it will not be repeated in the present disclosure.

It is noted that, shapes of the intermediate layer and the multiplication/window layer in FIG. 1B are circular, but shapes of the intermediate layer and the multiplication/window layer in the embodiment of the present disclosure are not limited thereto.

It is noted that, the term "multiplier/window layer" used in the present disclosure means that it can be referred to "multiplier layer" or "window layer". In other words, the multiplication/window layer presented herein can be used interchangeably with the multiplication layer or with the window layer.

The present disclosure has been described with a preferred embodiment thereof and it is understood that many changes and modifications to the described embodiment can be carried out without departing from the scope and the spirit of the disclosure that is intended to be limited only by the appended claims.

The invention claimed is:

1. A non-diffusion type photodiode, comprising:
   a substrate;
   a buffer layer disposed on the substrate;
   a light absorption layer disposed on the buffer layer;
   an intermediate layer disposed on the light absorption layer and having a first boundary, wherein the intermediate layer is an I-type semiconductor layer or a graded refractive index layer, and
   a multiplication/window layer disposed on the intermediate layer and having a second boundary, wherein in a top view, a sidewall of the intermediate layer defines the first boundary, and a sidewall of the multiplication/window layer defines the second boundary, the first boundary surrounds the second boundary, and a distance between the first boundary and the second boundary is between 1 micrometer and 15 micrometers.

2. The non-diffusion type photodiode according to claim 1, wherein the distance between the first boundary and the second boundary is between 2 micrometers and 15 micrometers.

3. The non-diffusion type photodiode according to claim 1, wherein the buffer layer is an N-type buffer layer, the light absorption layer is an I-type light absorption layer, and the multiplication/window layer is a P-type multiplication/window layer.

4. The non-diffusion type photodiode according to claim 3, wherein material of the N-type buffer layer includes N-type InP.

5. The non-diffusion type photodiode according to claim 3, wherein material of the I-type light absorption layer includes I-type InGaAs.

6. The non-diffusion type photodiode according to claim 3, wherein material of the P-type multiplication/window layer includes P-type InAlAs.

7. The non-diffusion type photodiode according to claim 1, wherein the intermediate layer is an I-type semiconductor layer, and material of the I-type semiconductor layer includes I-type InP.

8. The non-diffusion type photodiode according to claim 1, further comprising a contact layer disposed on the multiplication/window layer.

9. The non-diffusion type photodiode according to claim 8, wherein the contact layer is a P-type contact layer, and material of the P-type contact layer includes P-type InGaAs.

* * * * *